United States Patent
Sakata et al.

(10) Patent No.: US 9,318,871 B2
(45) Date of Patent: Apr. 19, 2016

(54) SEMICONDUCTOR LASER DEVICE AND MANUFACTURING METHOD THEREOF, AND SUBMOUNT MANUFACTURING METHOD

(71) Applicant: NICHIA CORPORATION, Anan-shi, Tokushima (JP)

(72) Inventors: Hiroki Sakata, Tokushima (JP); Hiroaki Yuto, Awa (JP); Eiichiro Okahisa, Tokushima (JP); Kazuma Kozuru, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/261,520

(22) Filed: Apr. 25, 2014

(65) Prior Publication Data

US 2014/0321491 A1    Oct. 30, 2014

(30) Foreign Application Priority Data

Apr. 27, 2013  (JP) ................................ 2013-094807

(51) Int. Cl.
  *H01S 3/04* (2006.01)
  *H01S 5/024* (2006.01)
  *H01S 5/022* (2006.01)
  *H01S 5/323* (2006.01)

(52) U.S. Cl.
  CPC ......... *H01S 5/02476* (2013.01); *H01S 5/02276* (2013.01); *H01L 2224/48091* (2013.01); *H01L 2924/12044* (2013.01); *H01S 5/02212* (2013.01); *H01S 5/02236* (2013.01); *H01S 5/32341* (2013.01)

(58) Field of Classification Search
  CPC .. H01S 5/021; H01S 5/02469; H01S 5/02476
  USPC ........................................ 372/34, 36, 46.012
  See application file for complete search history.

(56) References Cited

U.S. PATENT DOCUMENTS

| | | | |
|---|---|---|---|
| 5,325,384 A * | 6/1994 | Herb et al. | 372/36 |
| 5,821,624 A * | 10/1998 | Pasch | 257/776 |
| 6,917,637 B2 * | 7/2005 | Nagano et al. | 372/35 |
| 7,061,949 B1 * | 6/2006 | Zhou et al. | 372/36 |
| 8,586,996 B2 | 11/2013 | Nishi | |
| 2007/0085101 A1 * | 4/2007 | Kim | 257/98 |
| 2008/0008217 A1 * | 1/2008 | Miller et al. | 372/36 |
| 2011/0128980 A1 * | 6/2011 | Kato | 372/43.01 |
| 2011/0188532 A1 * | 8/2011 | Hata et al. | 372/50.12 |
| 2013/0022069 A1 * | 1/2013 | Lee et al. | 372/38.02 |

FOREIGN PATENT DOCUMENTS

| | | | | |
|---|---|---|---|---|
| EP | 967304 A1 * | 12/1999 | | C30B 33/00 |
| JP | 09-027489 A | 1/1997 | | |
| JP | 2001-077024 A | 3/2001 | | |
| JP | 2005-019595 A | 1/2005 | | |
| JP | 2006-278609 A | 10/2006 | | |
| JP | 2008-135629 A | 6/2008 | | |

\* cited by examiner

*Primary Examiner* — Yuanda Zhang
(74) *Attorney, Agent, or Firm* — Squire Patton Boggs (US) LLP

(57) ABSTRACT

A semiconductor laser device can include an insulating single crystal SiC having a first surface, a second surface, and micropipes having openings in the first surface and the second surface. A conductive base can be provided on a side of the first surface of the single crystal SiC, and a semiconductor laser element can be provided on a side of the second surface of the single crystal SiC. An insulating member can be formed in the micropipes.

9 Claims, 3 Drawing Sheets

SEMICONDUCTOR LASER DEVICE AND MANUFACTURING METHOD THEREOF, AND SUBMOUNT MANUFACTURING METHOD

TECHNICAL FIELD

The present disclosure relates to a semiconductor laser device that uses a single crystal silicon carbide (SiC) as a submount.

BACKGROUND

A member with superior heat dissipation is favorably used as a submount of a semiconductor laser device (Japanese Patent Application Laid-open No. 2008-135629). Known examples of a member with superior heat dissipation include a single crystal SiC.

However, a plurality of pieces for submounts that are cut out from a single crystal SiC wafer include those having a hollow pipe-like defect referred to as a micropipe. When a micropipe is penetrated by a conductive member such as solder material, the insulating property of the single crystal SiC is destroyed and a semiconductor laser device using such a single crystal SiC becomes a defective product.

SUMMARY

In consideration thereof, an object of one embodiment is to provide a semiconductor laser device using a single crystal SiC whose yield is improved by suppressing a decline in insulating property that is attributable to micropipes as a submount, a method of manufacturing the semiconductor laser device, and a method of manufacturing the submount.

According to one embodiment, a semiconductor laser device including: an insulating single crystal SiC having a first surface, a second surface, and micropipes having openings in the first surface and the second surface; a conductive base provided on a side of the first surface of the single crystal SiC; a semiconductor laser element provided on a side of the second surface of the single crystal SiC; and an insulating member disposed in the micropipes.

BRIEF DESCRIPTION OF THE DRAWINGS

FIGS. 1A and 1B are schematic diagrams showing a general configuration of a semiconductor laser device according to an embodiment, wherein FIG. 1A is a perspective view and FIG. 1B is a cross section taken along A-A in FIG. 1A (a cutaway view from a semiconductor laser element 30 to a base 20 along a short direction of the semiconductor laser element 30);

DETAILED DESCRIPTION OF THE EMBODIMENTS

Figure 1A:
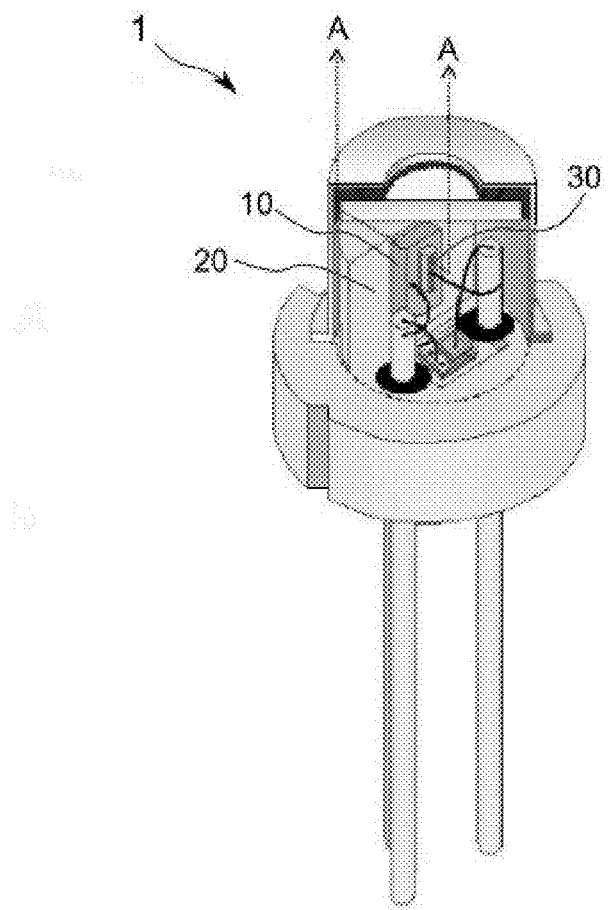
Figure 1B:
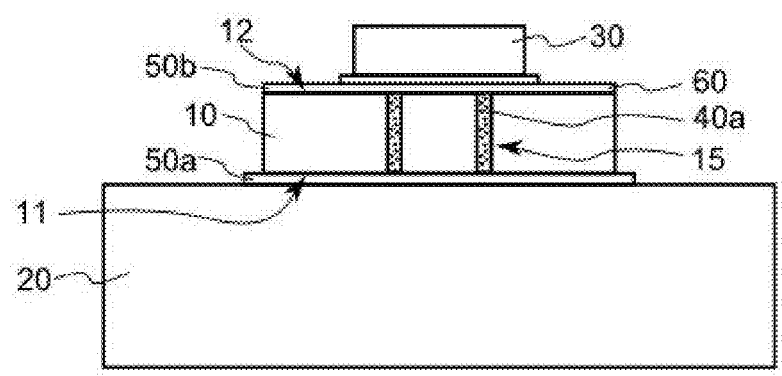

FIGS. 1A and 1B are schematic diagrams showing a general configuration of a semiconductor laser device according to an embodiment. FIG. 1A is a perspective view and FIG. 1B is a cross section taken along A-A in FIG. 1A (a cutaway view from a semiconductor laser element 30 to a base 20 along a short direction of the semiconductor laser element 30).

As shown in FIGS. 1A and 1B, a semiconductor laser device 1 according to an embodiment includes: an insulating single crystal SiC 10 having a first surface 11, a second surface 12, and micropipes 15 having openings in the first surface 11 and the second surface 12; a conductive base 20 provided on a side of the first surface 11 of the single crystal SiC 10; a semiconductor laser element 30 provided on a side of the second surface 12 of the single crystal SiC 10; and an insulating member 40a disposed in the micropipes 15.

The single crystal SiC 10 can be used as a submount. The submount is, for example, a member that is provided between the base 20 and the semiconductor laser element 30. Since the single crystal SiC 10 has superior heat dissipation as described earlier, the single crystal SiC 10 can be particularly favorably used as a submount of a semiconductor laser device using a high-output semiconductor laser element that generates a large amount of heat.

As an example of the single crystal SiC 10, an insulating single crystal SiC is used which has sufficient resistance to prevent a conductive part (for example, a base) that is provided on one surface thereof and a conductive part (for example, a semiconductor laser element) that is provided on the other surface thereof, from leaking. A single crystal SiC with specific resistance that equals or exceeds $1 \times 10^7$ Ω·cm may be used.

A shape of the single crystal SiC 10 is not particularly limited. Examples of the shape of the single crystal SiC 10 include a cuboid and a triangular prism.

A thickness of the single crystal SiC 10 is not particularly limited. However, for example, the thickness of the single crystal SiC 10 may be set to 100 μm or more since the single crystal SiC 10 is subjected to a load due to a difference in thermal expansion coefficients when the single crystal SiC 10 is bonded with the semiconductor laser element 30 and the base 20 and from the perspective of easiness of handling during manufacturing processes. In addition, by setting the thickness of the single crystal SiC 10 so as to exceed the thickness of the semiconductor laser element 30, heat from the semiconductor laser element 30 can be radiated in an efficient manner.

Moreover, when the thickness of the single crystal SiC 10 is equal to or less than 400 μm, since a distance between the first surface 11 and the second surface 12 of the single crystal SiC 10 is short, the insulating property is easily destroyed once a conductive member penetrates into the micropipes 15. Therefore, yield of a conventional semiconductor laser device using the single crystal SiC 10 with a thickness of 400 μm or less as a submount is not always favorable. However, according to the present embodiment, since the insulating property of the single crystal SiC 10 improves due to the insulating member 40a disposed in the micropipes 15, the yield of a semiconductor laser device using the single crystal SiC 10 with a thickness of 400 μm or less as a submount can be improved.

The micropipes 15 are mainly hollow pipe-like defects that extend in a crystal growth direction (a direction perpendicular to a C surface of a crystal) of the single crystal SiC 10. However, not all micropipes extend in a constant direction, and there may be micropipes that extend diagonally with respect to the C surface.

The micropipes 15 include micropipes that penetrate and micropipes that do not penetrate the single crystal SiC 10. Micropipes that do not penetrate the single crystal SiC 10 have openings in at least one of the first surface 11 and the second surface 12 of the single crystal SiC 10 in a similar manner to micropipes that penetrate the single crystal SiC 10. However, the micropipes 15 that penetrate the single crystal SiC 10 have openings in both of the first surface 11 and the second surface 12 of the single crystal SiC 10. Moreover, while the insulating member 40a is disposed in the micropipes 15 that penetrate the single crystal SiC 10, the insulating member 40a may or may not be disposed in the micropipes 15 that do not penetrate the single crystal SiC 10.

A diameter of the micropipes 15 ranges from, for example, around 0.1 μm to 100 μm. The present embodiment can be applied to the micropipes 15 having various diameters. However, a conductive member (bonding members 50a and 50b) such as solder is provided on at least one of the first surface 11 and the second surface 12 of the single crystal SiC 10, and such a member conceivably penetrates into the micropipes 15 due to a capillary phenomenon. Therefore, the present embodiment can be particularly favorably applied to the micropipes 15 with a small diameter which is more affected by a capillary phenomenon. Specifically, the present embodiment can be particularly favorably applied to the micropipes 15 with a diameter ranging from around 0.1 μm to 30 μm.

According to the present embodiment, even if a plurality of pieces for submounts that are cut out from a single crystal SiC wafer include a large number of those having a hollow pipe-like defect referred to as a micropipe (for example, included in a proportion of around 50%), since the insulating property of the single crystal SiC 10 is improved by the insulating member 40a disposed in the micropipes 15, the yield of a semiconductor laser device using the single crystal SiC 10 as a submount can be improved.

The base 20 can be provided on the side of the first surface 11 of the single crystal SiC 10. A conductive member such as copper, iron, and alloys thereof can be used for the base 20 so as to enable heat generated by the semiconductor laser element 30 to be released in an efficient manner.

When providing the base 20 on the side of the first surface 11 of the single crystal SiC 10, for example, the bonding member 50a that bonds the base 20 and the first surface 11 to each other can be used. A conductive member such as a solder material or a silver paste is used as the bonding member 50a so as to enable heat generated by the semiconductor laser element 30 to be released in an efficient manner.

The semiconductor laser element 30 can be provided on the side of the second surface 12 of the single crystal SiC 10.

When providing the semiconductor laser element 30 on the side of the second surface 12 of the single crystal SiC 10, for example, a metal layer 60 made of titanium, nickel, palladium, platinum, gold, and/or copper is provided on the second surface 12 of the single crystal SiC 10 and the semiconductor laser element 30 is mounted on the metal layer 60. While the semiconductor laser element 30 can be mounted by bonding using a bonding member (examples: a solder material such as AuSn, a conductive adhesive such as silver paste, and a metallic bump such as a gold bump), FIG. 1B shows a mode in which the semiconductor laser element 30 is mounted using the bonding member 50b as an example. Moreover, when using a member with high fluidity such as solder as the bonding member, it is conceivable that the conductive material can also readily penetrate into the micropipes 15 from the second surface 12. Therefore, in such a case, the insulating member 40a is favorably provided from one end to another end in the micropipes 15.

Various semiconductor laser elements such as GaN-based or GaAs-based semiconductor laser elements can be used as the semiconductor laser element 30. However, a difference in thermal expansion coefficients between GaN and the single crystal SiC 10 is small, and a GaN based semiconductor laser has a higher drive voltage than a GaAs based semiconductor laser and generates heat more readily. Therefore, the present embodiment which uses the single crystal SiC 10 with high heat dissipation as a submount is suitable for a semiconductor laser device using a GaN semiconductor laser element. Moreover, in order to secure superior heat dissipation, the semiconductor laser element 30 is favorably mounted in an area where the insulating member 40a is not disposed.

In addition to low-output (for example, equal to or lower than 0.5 W) semiconductor laser elements, high-output (for example, equal to or higher than 1 W and more particularly equal to or higher than 3.5 W) semiconductor laser elements can be used as the semiconductor laser element 30. Since a high-output semiconductor laser element generates more heat than a low-output semiconductor laser element, the present embodiment which uses the single crystal SiC 10 with high heat dissipation as a submount is suitable for a semiconductor laser device using a high-output semiconductor laser element.

The insulating member 40a is disposed in the micropipes 15. Accordingly, since conductive members such as the bonding members 50a and 50b are less likely to penetrate into the micropipes 15 from the side of the first surface 11 or the side of the second surface 12 of the single crystal SiC 10, the insulating property of the single crystal SiC 10 is improved.

Moreover, the closer the conductive member on the side of the first surface 11 and the conductive member on the side of the second surface 12 are to each other, the more easily an insulation breakdown of the single crystal SiC 10 occurs. An insulation breakdown may occur not only when the conductive member on the side of the first surface 11 and the conductive member on the side of the second surface 12 are connected to each other, but also when the conductive member on the side of the first surface 11 and the conductive member on the side of the second surface 12 are separated from but close to each other. Accordingly, the inside of the micropipes 15 is favorably completely filled in a gapless manner by the insulating member 40a so as to eliminate space that allows penetration of a conductive member such as the bonding members 50a and 50b.

However, even if a gap exists, the conductive member on the side of the first surface 11 and the conductive member on the side of the second surface 12 can be prevented from penetrating deeply into the micropipes 15 as long as the insulating member 40a is present. Therefore, the conductive member on the side of the first surface 11 and the conductive member on the side of the second surface 12 are more separated from each other as compared to a case where the insulating member 40a is not provided.

Accordingly, even in a case where the inside of the micropipes 15 is not completely filled by the insulating member 40a and a gap is present (for example, when there are gaps in around 80% to 90% of a capacity of the micropipes 15), the insulating property of the single crystal SiC 10 can be improved. When a gap is present, the insulating member 40a is favorably provided with a gap from the side of the first surface 11 to the side of the second surface 12 of the micropipes 15 (the insulating member 40a is distributed from one end to the other end of the micropipes 15). Accordingly, the conductive members can be prevented from deeply penetrating into the micropipes 15.

Moreover, for example, an insulation breakdown test performed by respectively providing conductive members on both surfaces of a single crystal SiC with a thickness of approximately 200 μm and a measurement of a voltage where an insulation breakdown occurs and a distance between one conductive member and the other conductive member revealed a correlation between the two and confirmed that insulation breakdown voltage tends to decline as the distance between conductive members decreases. This tendency was confirmed by plotting a relationship between insulation breakdown voltage and distances between conductive members for a plurality of samples on a graph representing insulation breakdown voltage on an abscissa and the distance between conductive members on an ordinate. Specifically, distances between conductive members were plotted on the graph described above for insulation breakdown voltages of 500 V, 700 V, 800 V, 900 V, and 1000 V, and a linear approximation line was drawn using a median of the distance between conductive members for each insulation breakdown voltage.

From the graph, the insulation breakdown voltage can conceivably be set to 250 V or higher if the distance between conductive members is 15 μm or more. However, since the insulation breakdown voltage is favorably set to 250 V or higher, the insulating member 40a that enables a distance between conductive members of 15 μm or more to be secured is favorably provided to obtain further superior insulating property. In addition, it is expected from the graph described above that an insulation breakdown does not occur until 500 V if the distance between conductive members is 30 μm or more. However, in a more favorable mode, in order to secure an insulation breakdown voltage of 500 V so as to increase withstand voltage of the single crystal SiC 10, the distance between conductive members is set to 30 μm or more, in which range it is expected that an insulation breakdown voltage of 500 V can be secured.

In this case, an insulation breakdown voltage is a voltage where a current suddenly starts to flow when voltage is increased in stages. In addition, the distance between conductive members refers to a shortest distance between the conductive member on the side of one surface and the conductive member on the side of the other surface. Since the shortest distance between the conductive members is reduced when a part of at least any one of the conductive member on the side of one surface and the conductive member on the side of the other surface penetrates into a micropipe, the shortest distance between the conductive members can be typically obtained by measuring a distance between conductive members in the micropipe. For example, the distance between conductive members can be measured by an X-ray photograph taken from a sidewise direction of a single crystal SiC.

When heat dissipation of the insulating member 40a is lower than that of the single crystal SiC 10, the first surface 11 and/or second surface 12 of the single crystal SiC 10 favorably has an area where the insulating member 40a is not disposed and, more favorably, an entire area of the first surface 11 and/or second surface 12 of the single crystal SiC 10 is an area where the insulating member 40a is not disposed. As a result, heat dissipation of the semiconductor laser device 1 can be improved.

Moreover, among the first surface 11 and the second surface 12 of the single crystal SiC 10, since the second surface 12 is the surface on which the semiconductor laser element 30 is provided, heat stagnation is more likely to occur than on the side of the first surface 11 that is the surface on which the base 20 is provided. Therefore, when there is a difference in amounts of the insulating member 40a between one surface and the other surface of the single crystal SiC 10, the surface with a greater amount of the insulating member 40a is favorably set as the first surface 11 that is the surface on which the base 20 is provided and the surface with a smaller amount of the insulating member 40a is favorably set as the second surface 12 that is the surface on which the semiconductor laser element 30 is provided.

A member made of an insulating material such as silicon oxide ($SiO_2$) or aluminum oxide ($Al_2O_3$) is used as the insulating member 40a. Alternatively, an insulating material such as silicon resin or epoxy resin may be used. When using a resin, a thermosetting resin is favorably used so as to prevent the resin from being melted by heat when the single crystal SiC 10 is bonded to the base 20 or the semiconductor laser element 30. In addition, since the higher the output of the semiconductor laser element 30, the more readily dust accumulation due to laser light occurs when using an organic substance, an inorganic substance such as $SiO2$ is favorably used to prevent dust accumulation.

As described above, according to the present embodiment, since the insulating member 40a is disposed in the micropipes 15 of the single crystal SiC 10, the conductive member on the side of the first surface 11 or the conductive member on the side of the second surface 12 is prevented from penetrating into the micropipes 15 and, even if such penetration occurs, the conductive member on the side of the first surface 11 and the conductive member on the side of the second surface 12 can be further separated from each other compared to a case where the insulating member 40a is not provided. Therefore, according to the present embodiment, the yield of a semiconductor laser device that uses the single crystal SiC 10 as a submount can be improved by suppressing a decline in insulating property attributable to the micropipes 15.

FIGS. 2A to 2E are schematic diagrams showing an example of a method of manufacturing a submount according to the present embodiment. Hereinafter, a description will be given with reference to FIGS. 2A to 2E.

Figure 2A:
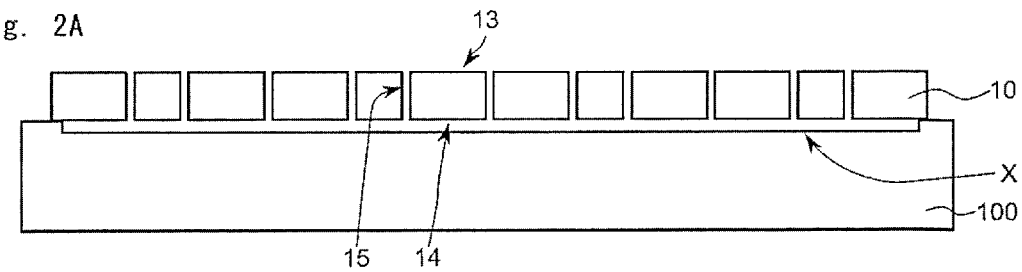
FIGS. 2A, 2B, 2C, 2D, and 2E are schematic diagrams showing an example of a method of manufacturing a submount according to an embodiment.

First, as shown in FIG. 2A, while orienting one surface 13 of the single crystal SiC 10 in a direction that differs from a side where a jig 100 is present, the other surface 14 of the single crystal SiC 10 and the jig 100 are oriented so as to face each other and the insulating single crystal SiC 10 is placed on the jig 100. The jig 100 is an adsorption table or the like that is a stand on which the single crystal SiC 10 is placed.

A cavity X is provided in the jig 100 to facilitate adsorption of the single crystal SiC 10. For example, as shown in FIG. 2A, performing suction by providing the cavity X so that a depression is formed on the jig 100 and an outer edge of the single crystal SiC 10 comes into contact with the jig 100 causes pressure in the cavity X to drop. As a result, the single crystal SiC 10 can be fixed in a stable manner.

Moreover, an opening area of the cavity X can be set to, for example, around 98% (a proportion based on an area of the other surface 14) of the single crystal SiC 10. In this case, for example, around 97% (a proportion based on the area of the other surface 14) of the single crystal SiC 10 can be used as a submount. Accordingly, since around 1% (a proportion based on an area of the other surface 14) of the single crystal SiC 10 is removed without being used (97%=98%−1%: both proportions based on the area of the other surface 14), only a portion that is sufficiently adsorbed is used as a submount.

Figure 2B:
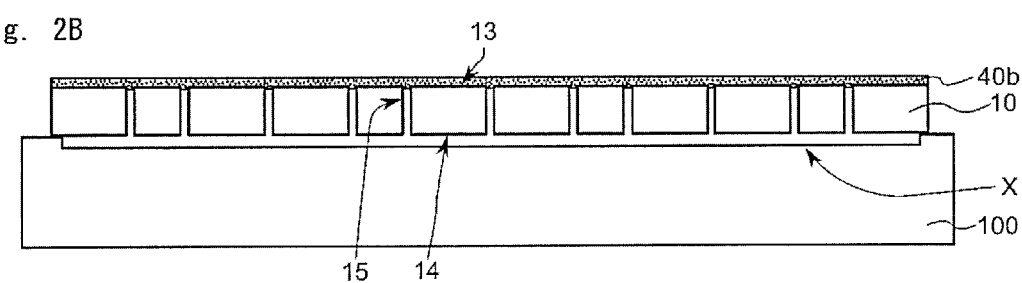

Next, as shown in FIG. 2B, a fluid object 40b containing an insulating material is applied to the one surface 13 of the single crystal SiC 10. For example, a solvent (such as an organic solvent) in which an insulating material is dissolved is used as the fluid object 40b (such as spin-on glass).

Figure 2C:
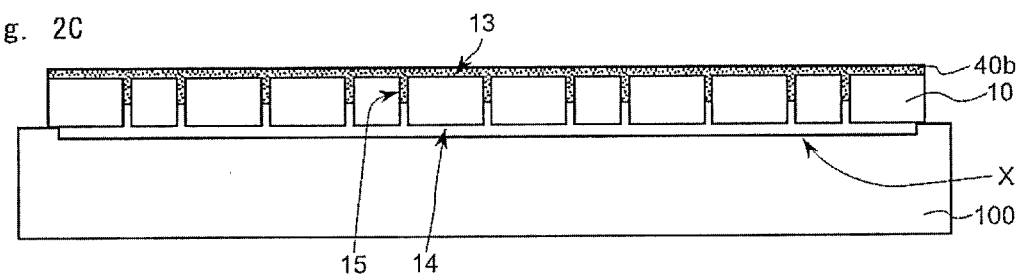

Next, as shown in FIG. 2C, the other surface 14 of the single crystal SiC 10 is adsorbed by the jig 100. Accordingly, the applied fluid object 40b is sucked from the other surface 14 of the single crystal SiC 10 into the micropipes 15. At this point, suction is favorably performed until the fluid object 40b reaches the other surface 14.

Figure 2D:
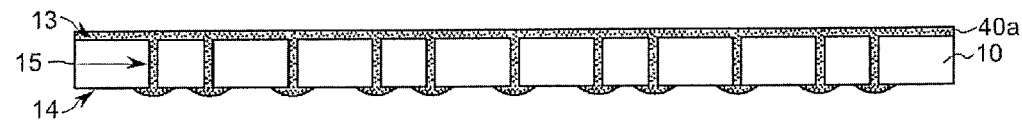

Next, as shown in FIG. 2D, the sucked fluid object 40b is hardened in the micropipes 15. Thus, the hardened fluid object 40*b* is obtained as the insulating member 40*a*. For example, when spin-on glass is used as the fluid object 40*b*, the fluid object 40*b* is dried to volatilize the solvent (a part of the fluid object 40*b*) and baked at a higher temperature than the drying temperature. Accordingly, pyrolysis of a metal organic compound starts during the baking, and a metal oxide (SiO2) is formed. In this case, SiO2 is formed in the micropipes 15 as the insulating member 40*a*.

Moreover, when a part of the fluid object 40*b* is volatilized as described above, the volume of the insulating member 40*a* is reduced as compared to the state of the fluid object 40*b*. Therefore, for example, a state where gaps occupying around 80% to 90% of the capacity of the micropipes 15 exists in the micropipes 15 instead of a state where the micropipes 15 is completely filled with the insulating member 40*a* in a gapless manner. However, as described earlier, the insulating property of the single crystal SiC 10 is improved even in such a state.

Figure 2E:
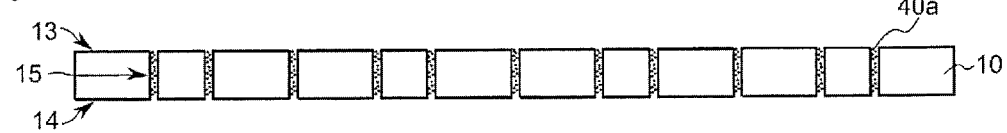

Next, as shown in FIG. 2E, the insulating member 40*a* (in other words, the insulating member 40*a* which is not sucked into the micropipes 15 and which remains outside of the micropipes 15) formed on the one surface 13 and/or the other surface 14 of the single crystal SiC 10 is removed. Accordingly, an area where the insulating member 40*a* is not formed is provided on the one surface 13 and/or the other surface 14 of the single crystal SiC 10. Generally, since heat dissipation of the insulating member 40*a* is lower than that of the single crystal SiC 10, heat dissipation of the semiconductor laser device 1 is improved by providing such an area where the insulating member 40*a* is not formed.

Moreover, when removing a part of the insulating member 40*a*, the insulating member 40*a* is to be formed on the one surface 13 and/or the other surface 14 of the single crystal SiC 10. In this case, the thickness of the insulating member 40*a* is favorably set to 1 µm or less. As described earlier, generally, since heat dissipation of the insulating member 40*a* is lower than that of the single crystal SiC 10, heat dissipation of the semiconductor laser device 1 is improved by adopting such a configuration.

When removing the insulating member 40*a*, a method is favorably used in which the insulating member 40*a* is preferentially removed (removed at a faster rate) than the single crystal SiC 10. Accordingly, since the removal of the insulating member 40*a* is promoted while removal of the single crystal SiC 10 is suppressed, only the insulating member 40*a* can be removed as much as possible without removing the single crystal SiC 10.

Examples of such a method include performing wet etching using a solution by which the insulating member 40*a* is more likely to be removed (removed at a greater etching rate) than the single crystal SiC 10. As such a solution, for example, when the insulating member 40*a* is SiO2, an alkaline solution is favorably used. Specifically, a KOH (potassium hydroxide) solution or a NaOH (sodium hydroxide) solution is favorably used.

Another example of the method described above involves performing mechanical polishing using abrasive grains by which the insulating member 40*a* is more likely to be removed (removed at a greater removal rate) than the single crystal SiC 10. For example, silica (SiO2) is favorably used as the abrasive grains. Using the mechanical polishing, only the insulating member 40*a* formed on the one surface 13 and/or the other surface 14 of the single crystal SiC 10 can be removed without removing the insulating member 40*a* formed in the micropipes 15.

Yet another example of the method described above is chemical mechanical polishing (CMP) that uses both the solution described above and the abrasive grains described above. Using CMP, since a flatter surface can be obtained, the base 20, the semiconductor laser element 30, and the like can be more readily fixed to the one surface 13 and/or the other surface 14 of the single crystal SiC 10 in a stable manner. In addition, using CMP, since the removal amount of the single crystal SiC 10 can be reduced in comparison to mechanical polishing, film thickness variation of the single crystal SiC 10 can be reduced. Furthermore, since damage due to polishing can be reduced, adhesion with the bonding members 50*a* and 50*b* can be improved.

With the method of manufacturing a submount according to the present embodiment described above, since the fluid object 40*b* to become the insulating member 40*a* is first applied to one surface 13 of the single crystal SiC 10 and the other surface 14 of the single crystal SiC 10 is subsequently adsorbed by the jig 100, the insulating member 40*a* can be accurately formed in the micropipes 15 in a shorter period of time (around several minutes) as compared to a method of forming the insulating member 40*a* in the micropipes 15 by CVD or thermal oxidation. Therefore, the method of manufacturing a submount according to the present embodiment is suitable for mass production of the semiconductor laser device 1 according to the present embodiment. In addition, since the fluid object 40*b* is fed into the micropipes 15 by adsorption, even when the micropipes 15 extend in an inclined direction with respect to a primary surface or the micropipes 15 bend inside the single crystal SiC 10, the insulating member 40*a* can be formed inside the micropipes 15.

Moreover, while the single crystal SiC 10 used in the steps described above may be in a state after being cut out from a wafer to be used as a submount, the single crystal SiC 10 is more favorably in a wafer state prior to being cut. This is because a wafer state is more suitable for mass production.

A wafer state is also more suitable for the single crystal SiC 10 that is used in the steps described above because a portion of the single crystal SiC 10 that comes into contact with the jig 100 (the 2% portion referred to in the description of the first step) is not adsorbed by the jig 100 and the insulating member 40*a* is not formed in the micropipes 15 in this portion.

In other words, since performing the steps described above using the single crystal SiC 10 in a wafer state enables pieces to be used as submounts to be cut out while excluding an outer edge portion (the 2% portion referred to in the description of the first step) which had been in contact with the jig 100, only an area in which the insulating member 40*a* is formed can be used as submounts. A dicing step is favorably performed after the fourth step described earlier in which the fluid object 40*b* is hardened. Furthermore, since the fifth step described earlier can be performed more efficiently in a wafer state than in a diced state, the dicing step is more favorably performed after the fifth step.

Moreover, as described above, the present embodiment is configured so that only a portion that has been sufficiently sucked is used as submounts by cutting out submounts while excluding an area created by further adding a margin of 1% to the outer edge portion (the 2% portion referred to in the description of the first step) which had been in contact with the jig 100.

Figure 3A:
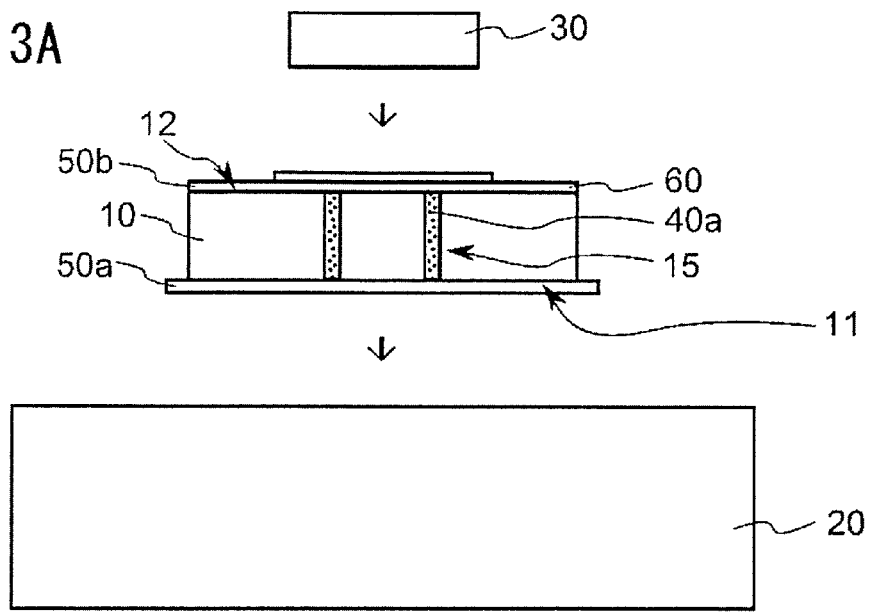
FIGS. 3A and 3B are schematic diagrams showing an example of a method of manufacturing a semiconductor laser device according to an embodiment which uses a submount formed by steps shown above.
Figure 3B:
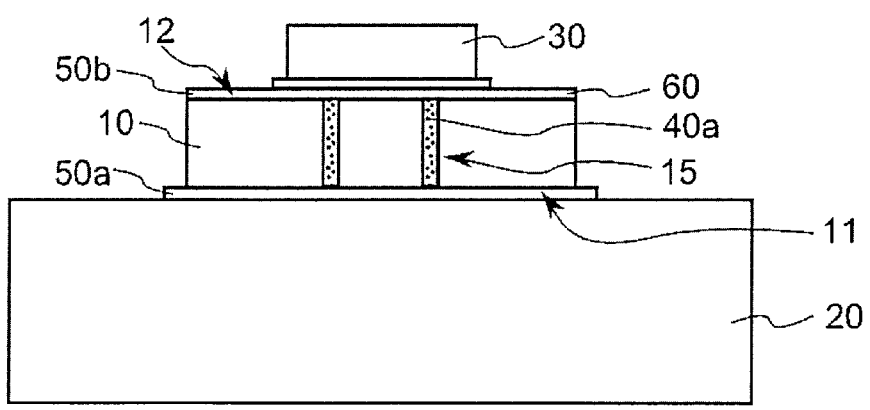

FIGS. 3A and 3B are schematic diagrams showing an example of a method of manufacturing a semiconductor laser device according to the present embodiment which uses a submount formed by the steps described above.

After the steps described earlier, for example, the other surface 14 of the single crystal SiC 10 which had been adsorbed by the jig 100 can be used as the second surface 12 of the single crystal SiC 10 and the semiconductor laser element 30 can be provided on the side of this surface, and the one surface 13 of the single crystal SiC 10 on which the fluid object 40b had been applied can be used as the first surface 11 of the single crystal SiC 10 and the base 20 can be provided on the side of this surface.

This can be performed by, for example, as shown in FIG. 3A, providing the metal layer 60 on the other surface 14 (the second surface 12) of the single crystal SiC 10, providing the conductive bonding members 50a and 50b in a solid state on the other surface 14 (the second surface 12) and the one surface 13 (the first surface 11) of the single crystal SiC 10, placing the one surface 13 (the first surface 11) of the single crystal SiC 10 on the heated base 20, and placing the semiconductor laser element 30 on the other surface 14 (the second surface 12) of the single crystal SiC 10.

Accordingly, as shown in FIG. 3B, the bonding members 50a and 50b that had been in a solid state are melted by the heat of the base 20 and the base 20 is bonded to a side of the one surface 13 (the first surface 11) of the single crystal SiC 10, and, at the same time of or just before or after the bonding, the semiconductor laser element 30 is bonded to a side of the other surface 14 (the second surface 12) of the single crystal SiC 10.

Therefore, the conductive base 20 is fixed to a side of the one surface 13 (the first surface 11) of the single crystal SiC 10 and the semiconductor laser element 30 is provided on a side of the other surface 14 (the second surface 12) of the single crystal SiC 10.

Moreover, in a departure from the steps described earlier, it is also possible to use the other surface 14 of the single crystal SiC 10 which had been adsorbed by the jig 100 as the first surface 11 of the single crystal SiC 10 and provide the base 20 on the side of this surface, and to use the one surface 13 of the single crystal SiC 10 on which the fluid object 40b had been applied as the second surface 12 of the single crystal SiC 10 and provide the semiconductor laser element 30 on the side of this surface.

However, as shown in FIG. 2D, since the one surface 13 of the single crystal SiC 10 is a surface on which the fluid object 40b is applied, the amount of the insulating member 40a tends to exceed that on the other surface 14 of the single crystal SiC 10 unless the insulating member 40a is appropriately removed.

Therefore, as described earlier, favorably, the other surface 14 of the single crystal SiC 10 which had been adsorbed by the jig 100 is used as the second surface 12 of the single crystal SiC 10 and the one surface 13 of the single crystal SiC 10 on which the fluid object 40b had been applied is used as the first surface 11 of the single crystal SiC 10.

Accordingly, among the one surface 13 and the other surface 14 of the single crystal SiC 10, the surface with a larger amount of the insulating member 40a is provided with the base 20 and the surface with a smaller amount of the insulating member 40a (including a surface on which the insulating member 40a is not formed at all) is provided with the semiconductor laser element 30.

Moreover, while the single crystal SiC 10 is used as a submount of the semiconductor laser device 1 in the present embodiment, the single crystal SiC 10 can also be used in devices other than a semiconductor laser device such as an LED device. However, since a semiconductor laser element differs from an LED element in that an area of a light emitting region among an area of the entire element is extremely small, heat tends to concentrate in the light emitting region. Therefore, higher heat dissipation is demanded. For this reason, a single crystal SiC that is a material with superior thermal conductivity is conceivably particularly suitable as a submount (heat sink) on which a semiconductor laser element is mounted.

While an embodiment has been described above, the descriptions simply relate to one example of the present invention. The present invention is by no means limited by the descriptions.

DENOTATION OF REFERENCE NUMERALS

1 semiconductor laser device
10 single crystal SiC (submount)
11 first surface
12 second surface
13 one surface
14 other surface
15 micropipe
20 base
30 semiconductor laser element
40a insulating member
40b fluid object
50a bonding member
50b bonding member
60 metal layer
100 jig

What is claimed is:

1. A semiconductor laser device, comprising:
an insulating single crystal SiC having a first surface, a second surface, and micropipes having openings in the first surface and the second surface;
a conductive base provided on a side of the first surface of the single crystal SiC;
a semiconductor laser element provided on a side of the second surface of the single crystal SiC; and
an insulating member disposed in the micropipes, wherein the insulating member is also disposed on the first surface and the second surface of the single crystal SiC in addition to inside the micropipes, and an amount of the insulating member that is disposed on the side of the second surface of the single crystal SiC is smaller than an amount of the insulating member that is disposed on the side of the first surface of the single crystal SiC.

2. The semiconductor laser device according to claim 1, wherein gaps are provided in the micropipes.

3. A semiconductor laser device comprising:
an insulating single crystal SiC including a first surface, a second surface, and micropipes having openings in the first surface and the second surface;
a conductive base provided on the side of the first surface of the single crystal SiC;
a semiconductor laser element provided on the side of the second surface of the single crystal SiC;
a first conductive member comprising a first conductive bonding member provided on the first surface of the single crystal SiC; and
a second conductive member comprising a second conductive bonding member provided on the second surface of the single crystal SiC and that is insulated from the first conductive member,
wherein a part of at least one of the first conductive member and the second conductive member penetrates into the micropipes, and
wherein the micropipes are crystal defects in the single crystal SiC.

4. The semiconductor laser device according to claim 3, wherein a distance between the first conductive member and the second conductive member is at least 15 μm.

5. The semiconductor laser device according to claim 3, wherein the first surface and the second surface of the single crystal SiC are areas in which the insulating member is not disposed across the entire area.

6. The semiconductor laser device according to claim 3, wherein the first conductive member and the second conductive member are insulated from each other so that an insulation breakdown voltage is 250 V or higher.

7. The semiconductor laser device according to claim 6, wherein a distance between the first conductive member and the second conductive member is 15 μm or more.

8. The semiconductor laser device according to claim 6, wherein a thickness of the single crystal SiC is at least 100 μm and no more than 400 μm.

9. The semiconductor laser device according to claim 6, wherein a specific resistance of the single crystal SiC is at least $1 \times 10^7$ Ω·cm.

* * * * *